United States Patent
Liao et al.

(10) Patent No.: US 10,276,543 B1
(45) Date of Patent: Apr. 30, 2019

(54) SEMICONDCUTOR DEVICE PACKAGE AND METHOD OF FORMING SEMICONDCUTOR DEVICE PACKAGE

(71) Applicant: Taiwan Semiconductor Manufacturing Co., Ltd., Hsinchu (TW)

(72) Inventors: Sih-Hao Liao, New Taipei (TW); Hung-Jui Kuo, Hsinchu (TW); Yu-Hsiang Hu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/795,273

(22) Filed: Oct. 27, 2017

(51) Int. Cl.
| | |
|---|---|
| H01L 23/495 | (2006.01) |
| H01L 25/065 | (2006.01) |
| H01L 25/00 | (2006.01) |
| H01L 23/544 | (2006.01) |
| H01L 23/498 | (2006.01) |
| H01L 23/00 | (2006.01) |

(52) U.S. Cl.
CPC .... *H01L 25/0657* (2013.01); *H01L 23/49822* (2013.01); *H01L 23/544* (2013.01); *H01L 23/562* (2013.01); *H01L 25/50* (2013.01); H01L 2223/54426 (2013.01); H01L 2225/06548 (2013.01)

(58) Field of Classification Search
USPC ........................................ 257/668; 438/109
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,059,107 B2 * | 6/2015 | Pan .................... H01L 21/56 |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |

(Continued)

*Primary Examiner* — Niki H Nguyen
(74) *Attorney, Agent, or Firm* — JCIPRNET

(57) ABSTRACT

A semiconductor device package includes a lower redistribution structure, an upper encapsulated semiconductor device and an upper redistribution structure. The lower redistribution structure includes a first dielectric layer, a RDL, a second dielectric layer, and a second RDL. The first RDL is disposed on the first dielectric layer and includes a circuit portion and an alignment mark portion insulated from the circuit portion. The second dielectric layer is disposed on the first RDL, wherein the second dielectric layer covers the alignment mark portion. The second RDL is disposed on the second dielectric layer and electrically connected to the first RDL. The upper encapsulated semiconductor device is disposed on the lower redistribution structure. The upper redistribution structure is disposed on the upper encapsulated semiconductor device.

20 Claims, 10 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,496,189 B2 | 11/2016 | Yu et al. |
| 2017/0271283 A1* | 9/2017 | Lee .......................... H01L 24/02 |

* cited by examiner

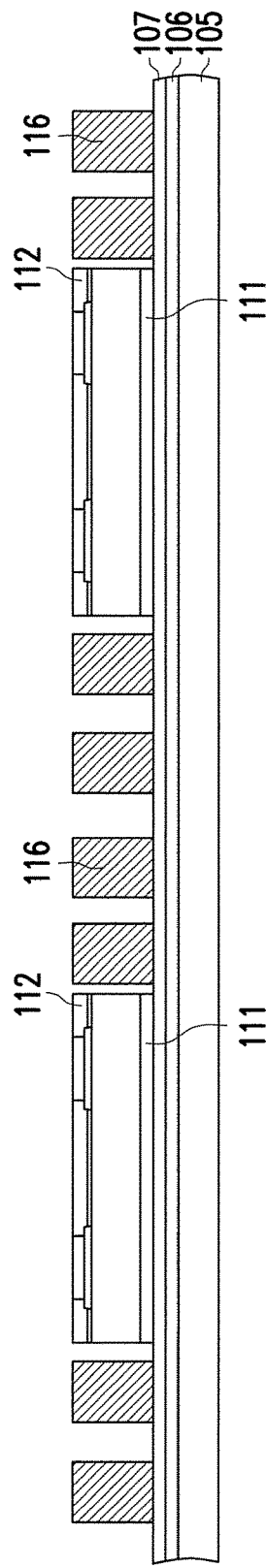
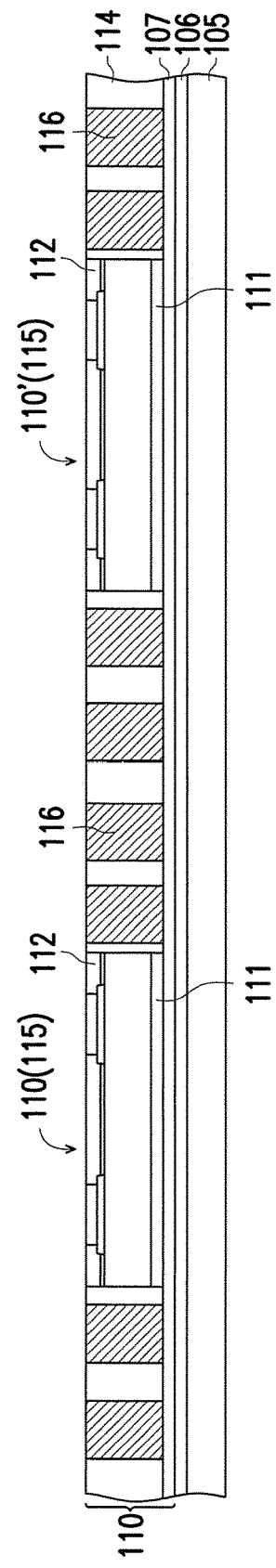

SEMICONDCUTOR DEVICE PACKAGE AND METHOD OF FORMING SEMICONDCUTOR DEVICE PACKAGE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 8 illustrate cross sectional views of intermediate stages in the manufacturing of a semiconductor device package according to some exemplary embodiments of the present disclosure.

DETAILED DESCRIPTION

Figure 3:
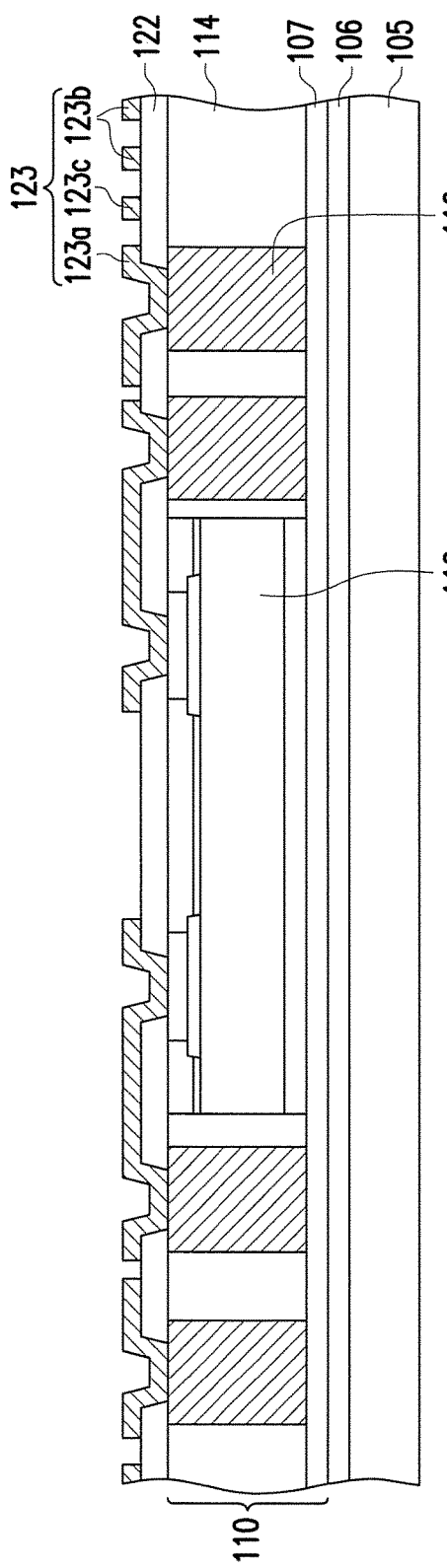

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 8 illustrate cross sectional views of intermediate stages in the manufacturing of a semiconductor device package according to some exemplary embodiments of the present disclosure. Referring to FIG. 1 and FIG. 2, in some embodiments, a lower reconstructed wafer 115 is formed on a carrier 105. The lower reconstructed wafer 115 includes a plurality of lower encapsulated semiconductor devices 110, 110'. It is noted that the present disclosure will be described with respect to a multi-chip wafer-level semiconductor packaging process. The embodiments may also be applied, however, to a variety of semiconductor packaging process. In the embodiment, two encapsulated semiconductor devices 110, 110' are depicted for illustration purpose, but the disclosure does not limit the numbers of the lower encapsulated semiconductor devices 110, 110' for forming the lower reconstructed wafer 115. For the purpose of the brevity and clarity, FIG. 3 to FIG. 8 merely illustrate the manufacturing process applied to one of the lower encapsulated semiconductor devices (e.g. the lower encapsulated semiconductor device 110).

In some embodiments, the carrier 105 may be a glass carrier, a ceramic carrier, or the like. The carrier 105 may have a round top-view shape and may be a size of a silicon wafer. A release layer 106 may be provided on the carrier 105. In some embodiments, the release layer 106 may be removed along with carrier 105 from the overlying structures that will be formed in subsequent steps. The release layer 106 may include an adhesive or a glue material. In some embodiments, the release layer 106 may be dispensed as a liquid and cured. In other embodiments, the release layer 106 may be formed by lamination. In some embodiments, the release layer 106 is photosensitive and is easily detached from carrier 105 by irradiating with ultra-violet (UV) light or laser. For example, the release layer 106 may include a light-to-heat-conversion (LTHC) coating. In some other embodiments, the release layer 106 includes heat-sensitive adhesive. In some embodiments, a dielectric layer 107 may be formed on the release layer 106 and over the carrier 105 as shown in FIG. 1.

Accordingly, a plurality of lower conductive pillars 116 may be formed on the carrier 105. In some embodiments, the lower conductive pillars 116 are formed by plating. Then, a plurality of lower semiconductor devices 112 is disposed on the carrier 105 and is disposed aside and between the lower conductive pillars 116. In some embodiments, the lower semiconductor devices 112 are attached to the carrier 105 through an adhesive layer 111, as shown in FIG. 1 in accordance with some embodiments. The adhesive layer 111 may be a die attach film (DAF), in accordance with some embodiments. The DAF may be made of epoxy resin, phenol resin, acrylic rubber, silica filler, or a combination thereof. FIG. 1 shows that connectors 112a of the lower semiconductor devices 112 are facing away from the carrier 105.

Then, a lower encapsulating material 114 is formed on the carrier to encapsulate the lower semiconductor devices 112 and the lower conductive pillars 116. In some embodiments, the lower encapsulating material 114 may be a liquid molding compound material applied over the carrier 105 to fill the space between the lower conductive pillars 116 and the lower semiconductor devices 112 and, in some cases, to cover the lower conductive pillars 116 and the lower semiconductor devices 112. A curing process may then be applied to harden the lower encapsulating material 114.

In the embodiments of the lower encapsulating material fully covering the lower conductive pillars 116 and the lower semiconductor devices 112, a planarization process may then be applied to remove the excess lower encapsulating material to reveal top surfaces of the lower conductive pillars 116 and the connectors 112a of the lower semiconductor devices 112. In some embodiments, the planarization process includes a grinding process. In some other embodiments, the planarization process includes a chemical-mechanical polishing (CMP) process. In some embodiments, the planarization process may be omitted if the top surfaces of the lower conductive pillars 116 and the connectors 112a of the lower semiconductor devices 112 are already exposed by the lower encapsulating material 114. At the time, the lower reconstructed wafer 115 including a plurality of lower encapsulated semiconductor devices 110, 110' is formed on the carrier 105 as it is shown in FIG. 2. Accordingly, each of the lower encapsulated semiconductor devices 110, 110' includes the lower semiconductor device 112 encapsulated by the lower encapsulating material 114 and the lower conductive pillars 116 extended through the lower encapsulating material 114.

For the purpose of the brevity and clarity, the following description and figures would describe with respect to manufacturing process of single semiconductor device package, but one of ordinary skills in the art should understand that such manufacturing process may be applied with respect to embodiments in wafer-level semiconductor packaging process.

Figure 4:
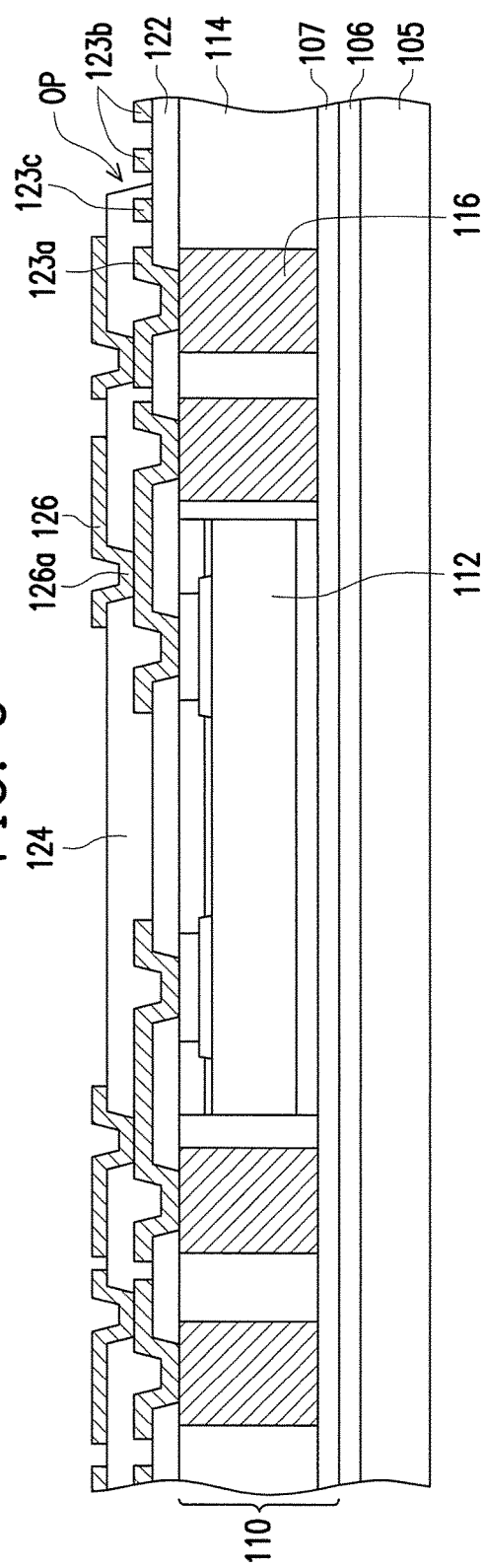
Figure 5:
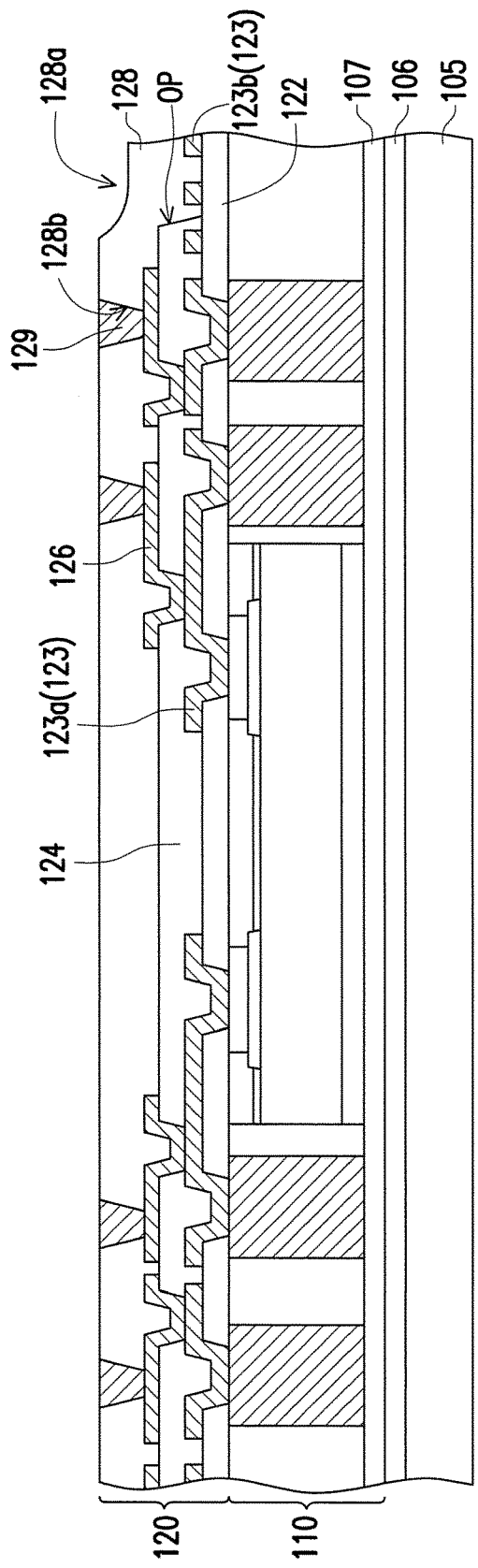

Referring to FIG. 3 to FIG. 5, a lower redistribution structure 120 is formed on the lower encapsulated semiconductor device 110. In some embodiments, the lower redistribution structure 120 may include a plurality of redistribution lines (RDLs), such as RDLs 123 and 126, which are insulated by one or more dielectric layers, such as dielectric layers 122, 124 and 128. The RDLs 123 and 126 may include circuit lines and conductive vias. The RDLs 123 and 126 are made of a conductive material and may directly contact the lower conductive pillars 116 and the connectors of the lower semiconductor device 112. In some embodiments, the material of the RDLs 123 and 126 includes aluminum, aluminum alloy, copper, or copper-alloy. However, the RDLs 123 and 126 may be made of other types of conductive materials. The dielectric layers 122, 124 and 128 are made of dielectric material(s) and provide stress relief for bonding stress incurred during bonding process. In some embodiments, the dielectric layers 122, 124 and 128 are made of polymer materials, such as polyimide, polybenzoxazole (PBO), or benzocyclobutene (BCB).

In some embodiments, the process of forming the lower redistribution structure 120 may include the following steps. Referring to FIG. 3, a first dielectric layer 122 is formed on the lower encapsulated semiconductor device 110. Then, a first RDL 123 is formed on the first dielectric layer 122. In some embodiments, the first RDL 123 may include a circuit portion 123a, an alignment mark portion 123b and a seal ring 123c. The circuit portion 123a is electrically connected to the lower semiconductor device 112 of the lower encapsulated semiconductor device 110. In some embodiments, the circuit portion 123a may be electrically connected to the lower conductive pillars 116. In some embodiments, the alignment mark portion 123b is electrically insulated from the circuit portion 123a and the lower semiconductor device 112 and is thus electrically floating.

Figure 9:
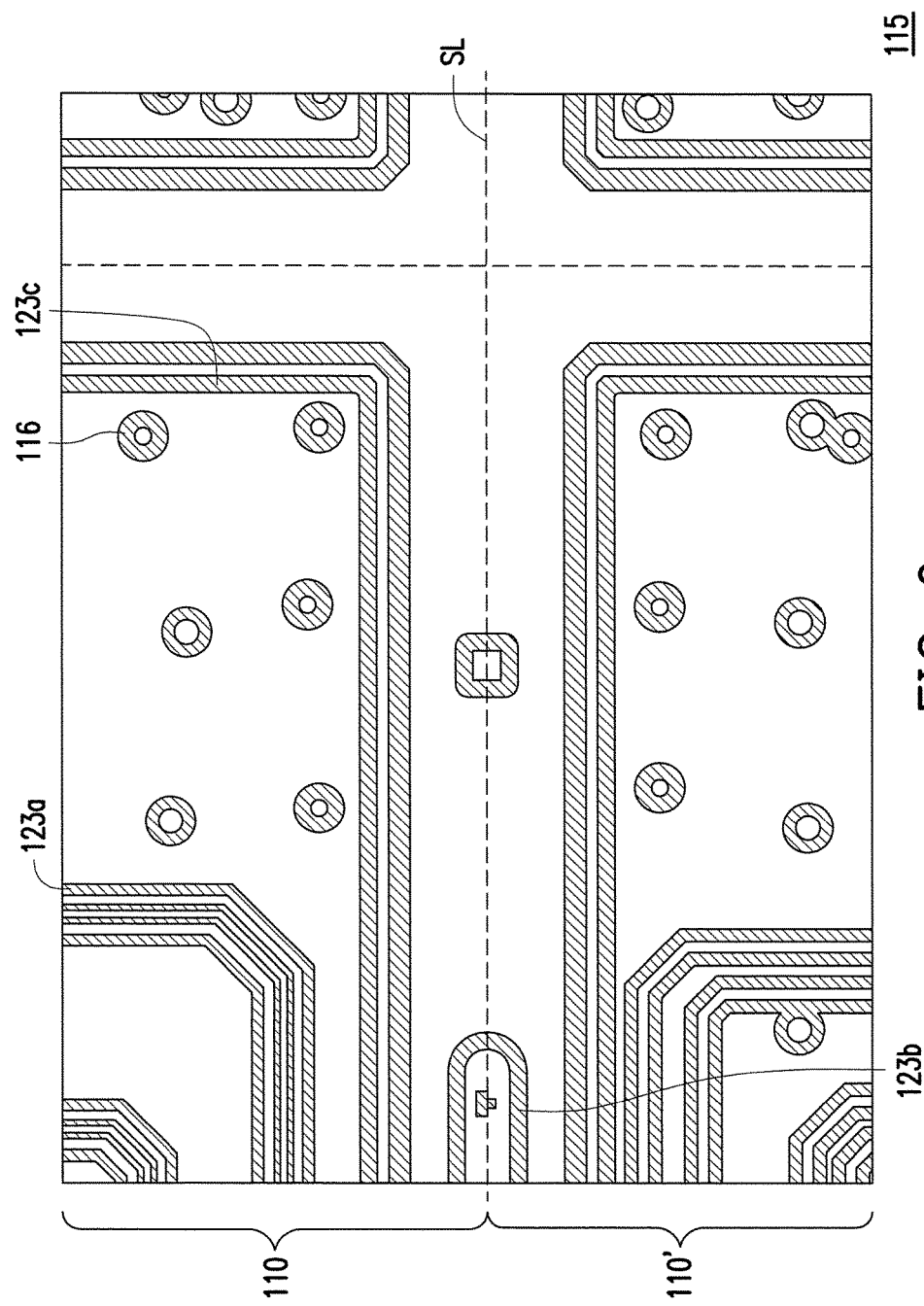
FIG. 9 illustrates a partial top view of an intermediate stage in the manufacturing of a semiconductor device package according to some exemplary embodiments of the present disclosure.

FIG. 9 illustrates a partial top view of an intermediate stage in the manufacturing of a semiconductor device package according to some exemplary embodiments of the present disclosure. Referring to FIG. 3 and FIG. 9, in some embodiments, the seal ring 123c surrounds the circuit portion 123a, and the seal ring 123c is separated from and located between the circuit portion 123a and the alignment mark portion 123b as shown in FIG. 9. The alignment mark portion 123b is configured for assisting alignment in a subsequent bonding process. In some embodiments, the alignment mark portion 123b is extended to and beyond a boundary SL of the first dielectric layer 122. In one embodiment, "boundary of the first dielectric layer 122" may refer to a scribe line(s) where the resulting structure is scribed for forming a plurality of semiconductor device packages. In such embodiment, the alignment mark portion 123b may be disposed along the scribe line SL. In other words, the alignment mark portion 123b may be disposed on the boundary between two adjacent encapsulated semiconductor devices of the wafer and may be cut through during the scribing. Accordingly, after being scribed along the scribe line SL, the cut alignment mark portion 123b in the resulting structure is located beside and right next to the boundary SL of the first dielectric layer 122. Alternatively, each encapsulated semiconductor device of the wafer may have its own alignment mark portion. Namely, the alignment mark portion may be disposed within the boundary of each encapsulated semiconductor device of the wafer and may not be cut through during the scribing. In some embodiments, the number of the alignment mark portion 123b in each of the encapsulated semiconductor devices may be more than one. The disclosure does not limit number, formation and arrangement of the alignment mark portion.

In some embodiments, at least one of the dielectric layers 124/128 disposed on the first RDL 123 covers the alignment mark portion 123b to protect the alignment mark portion 123b from subsequent etching process. In one of the implementations, the second dielectric layer 128 is disposed on the first RDL 123 as shown in FIG. 5 and covers the alignment mark portion 123b.

In some embodiments, referring to FIG. 4 and FIG. 5, a third dielectric layer 124 may be disposed on the first RDL 123 before the second dielectric layer 128 is disposed on the first RDL 123. Then, a third RDL 126 is disposed on the third dielectric layer 124 and electrically connected to the first RDL 123 as shown in FIG. 4. In some embodiments, a plurality of via openings may be formed on the third dielectric layer 124 before the third RDL 126 is formed, and then the third RDL 126 is plated on the third dielectric layer 124 and fills the via openings of the third dielectric layer 124 to form a plurality of conductive vias 126a. The third RDL 126 is electrically connected to the first RDL 123 through the conductive vias 126a. Then, the second dielectric layer 128 is formed on the third RDL 126 as shown in FIG. 5. In some embodiments, at least one of the third dielectric layer 124 and the second dielectric layer 128 covers the alignment mark portion 123b to protect the alignment mark portion 123b from subsequent etching process. Then, a second RDL (including conductive vias 129) may be formed on the second dielectric layer 128. Accordingly, the lower redistribution structure 120 is formed.

Figure 10:
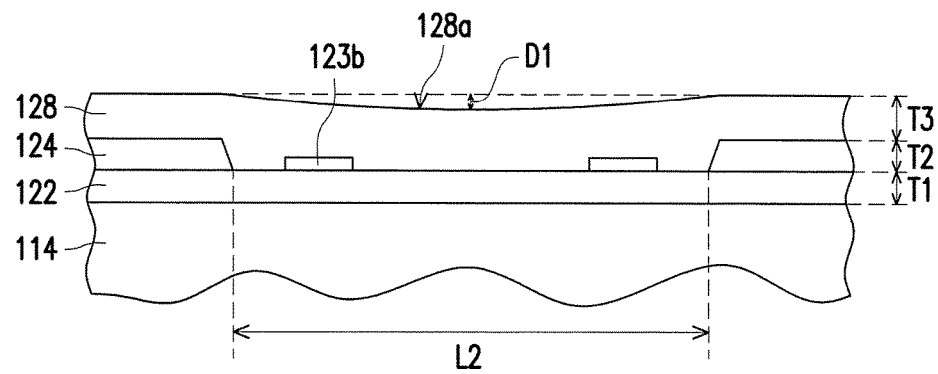
FIG. 10 illustrates a partial cross sectional view of an intermediate stage in the manufacturing of a semiconductor device package according to some exemplary embodiments of the present disclosure.
Figure 11:
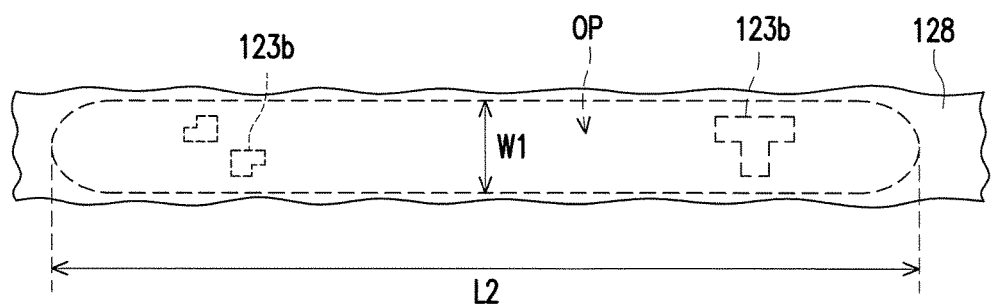
FIG. 11 illustrates a top view of a lower redistribution structure of a semiconductor device package according to some exemplary embodiments of the present disclosure.

FIG. 10 illustrates a partial cross sectional view of an intermediate stage in the manufacturing of a semiconductor device package according to some exemplary embodiments of the present disclosure. FIG. 11 illustrates a top view of a lower redistribution structure of a semiconductor device package according to some exemplary embodiments of the present disclosure. It is noted that FIG. 10 is the cross sectional view of the structure shown in FIG. 5 along the scribe line. Referring to FIG. 5, FIG. 10 and FIG. 11, in the present embodiment, it is the second dielectric layer 128 that covers the alignment mark portion 123b. For example, before the second dielectric layer 128 is formed, an opening OP may be formed on the third dielectric layer 124 for revealing the alignment mark portion 123b. When the second dielectric layer 128 is formed on the third dielectric layer 124, the second dielectric layer 128 fills the opening OP and covers the alignment mark portion 123b. In some embodiments, the opening OP may be formed by the same process (e.g. photolithography, etching, etc.) for forming the via openings 128b on the second dielectric layer 128. Accordingly, the alignment mark portion 123b is covered by the third dielectric layer 124 and/or the second dielectric layer 128, so as to prevent subsequent etching process (e.g. the etching process for forming upper conductive pillars 136) from damage the alignment mark portion 123b and/or even damage the seal ring 123c adjacent to the alignment mark portion 123b. In some embodiments, the third dielectric layer 124 and/or the second dielectric layer 128 covering the alignment mark portion 123b may be transparent, so the alignment mark portion 123b can still be seen through the third dielectric layer 124 and/or the second dielectric layer 128 during alignment of subsequent bonding process.

With such configuration, the second dielectric layer 128 would have a concave portion 128a accordingly. The concave portion 128a is located on a top surface of the second dielectric layer 128 corresponding to the alignment mark portion 123b and concave toward the alignment mark portion 123b as shown in FIG. 5 and FIG. 10. In one embodiment, a maximum depth D1 of the concave portion 128a is substantially equal to or less than 2 µm. In addition, a shortest distance L1 between the alignment mark portion 123b and the inner wall of the opening OP may substantially be 120 µm. A length L2 of the opening OP along the scribe line may substantially be 640 µm, and a width W1 of the opening OP along the scribe line may substantially be 85µm. A thickness T1 of the first dielectric layer 122 may substantially be 5 µm, a thickness T2 of the third dielectric layer 124 may substantially range from 5 µm to 7 µm, and a thickness T3 of the second dielectric layer 128 may substantially range from 5 µm to 8 µm. Certainly, the dimensions described above are merely for illustration, and the disclosure is not limited thereto.

Figure 12:
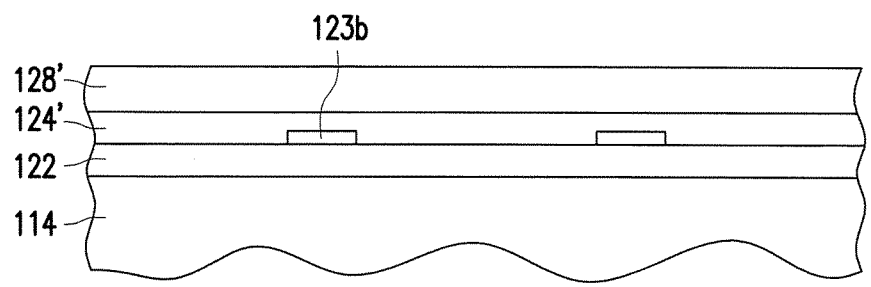
FIG. 12 illustrates a partial cross sectional view of an intermediate stage in the manufacturing of a semiconductor device package according to some exemplary embodiments of the present disclosure.

FIG. 12 illustrates a partial cross sectional view of an intermediate stage in the manufacturing of a semiconductor device package according to some exemplary embodiments of the present disclosure. It is noted that the embodiment shown in FIG. 12 contains many features same as or similar to the embodiment disclosed earlier with FIG. 10 and FIG. 11. For purpose of clarity and simplicity, detail description of same or similar features may be omitted, and the same or similar reference numbers denote the same or like components. The main differences between the embodiment shown in FIG. 12 and the embodiment shown in FIG. 10 and FIG. 11 are described as follows.

Alternatively, in the present embodiments, the third dielectric layer 124' and the second dielectric layer 128' both cover the alignment mark portion 123b. For example, the third dielectric layer 124' is formed on the first dielectric layer 122 and completely cover the alignment mark portion 123b underneath. Then, the second dielectric layer 128' is formed over the third dielectric layer 124'. Thereby, both of the third dielectric layer 124' and the second dielectric layer 128' are superimposed on the alignment mark portion 123b to prevent subsequent etching process (e.g. the etching process for forming upper conductive pillars 136) from damage the alignment mark portion 123b and/or even damage the seal ring 123c adjacent to the alignment mark portion 123b. With such configuration, a top surface of the second dielectric layer 128' corresponding to the alignment mark portion 123b may substantially be a planar surface as shown in FIG. 12 without having the concave portion 128a as shown in FIG. 10. In other embodiments, it may also be the third dielectric layer 124' that covers the alignment mark portion 123b, while the third dielectric layer having an opening for revealing the part of the third dielectric layer 124' covering the alignment mark portion 123b. In other embodiments, it may merely be the second dielectric layer 128' that covers the alignment mark portion 123b without the third dielectric layer 124' located between the first dielectric layer 122' and the second dielectric layer 128'. It is noted that the disclosure does not limit the numbers of the dielectric layers and the RDLs in the lower redistribution structure 120 as long as at least one of the dielectric layers located on the first RDL 123 covers the alignment mark portion 123b.

Figure 6:
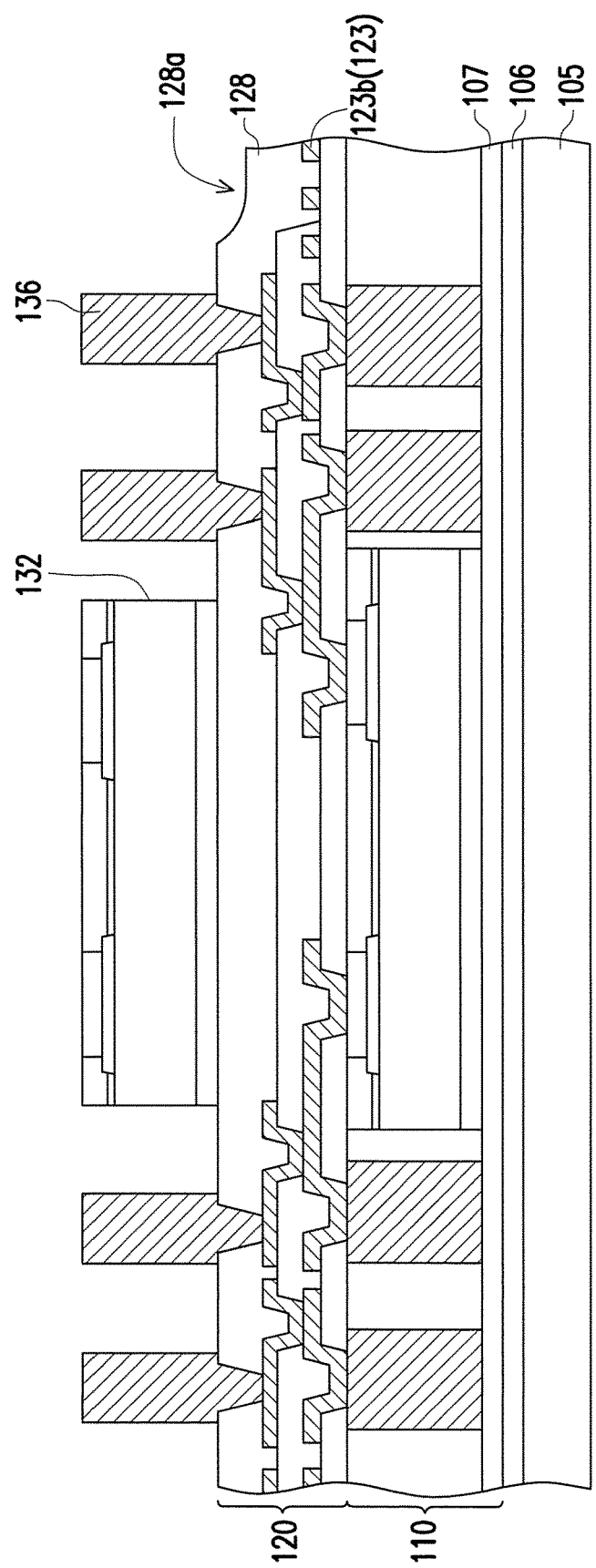
Figure 7:
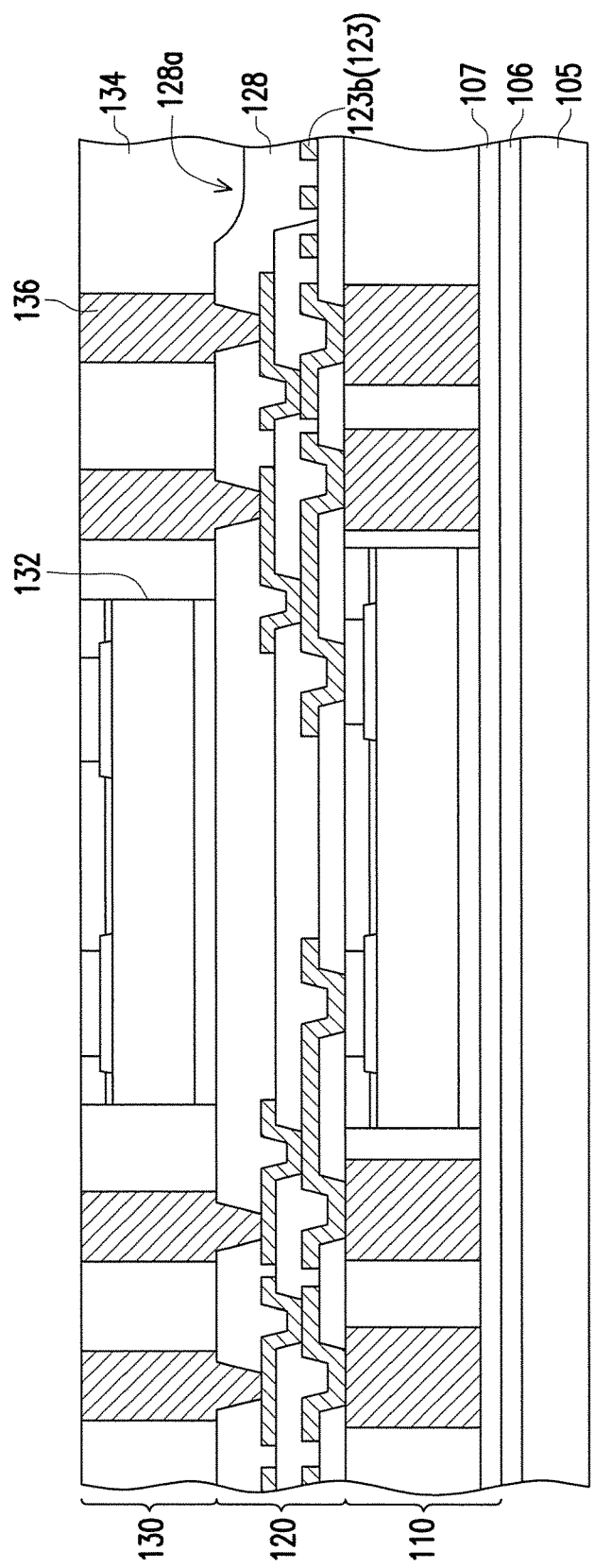

Then, referring to FIG. 6 and FIG. 7, an upper encapsulated semiconductor device 130 is formed on the lower redistribution structure 120. The process of forming the upper encapsulated semiconductor device 130 may be similar to the process of forming the lower encapsulated semiconductor device 110. For purpose of clarity and simplicity, detail description of same or similar features may be omitted, and the same or similar reference numbers denote the same or like components.

Figure 15:
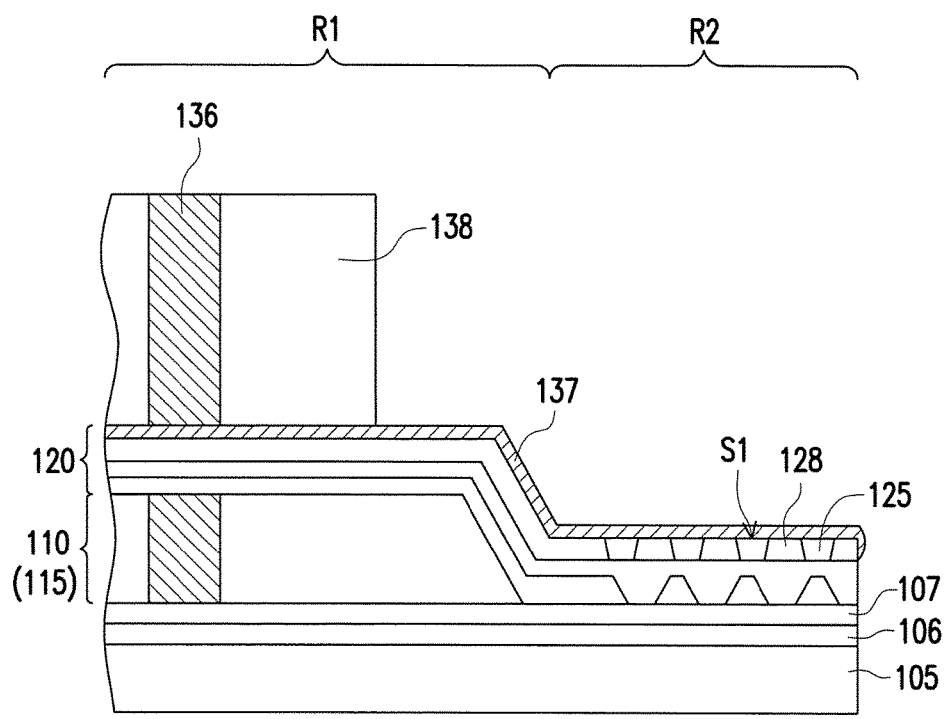

Referring to FIG. 6 and FIG. 15, a plurality of upper conductive vias 136 may be formed on the lower redistribution structure 120. It is noted that FIG. 15 illustrates a cross sectional view of an edge region of a semiconductor device package at an intermediate stage of the wafer-level packaging process, which will be described in detail later on. In some embodiments, the process of forming the upper conductive vias 136 may be similar to the process of forming the lower conductive vias 116. For example, a seed layer 137 may be formed on the lower redistribution structure 120, as shown in FIG. 15 in accordance with some embodiments. In some embodiments, the seed layer 137 may be made of copper and is formed by physical vapor deposition (PVD). However, other conductive film may also be used. For example, the seed layer 137 may be made of Ti, Ti alloy, Cu, and/or Cu alloy. The Ti alloy and Cu alloy may include silver, chromium, nickel, tin, gold, tungsten, and combinations thereof. In some embodiments, the seed layer 137 may further include a diffusion barrier layer. The seed layer 137 may also act as an adhesion layer to under layer. However, the diffusion barrier layer may be made of other materials, such as TaN, or other applicable materials. The diffusion barrier layer is formed by PVD in some embodiments.

Following the deposition of the seed layer 137, a patterned photoresist layer 138 is formed over the seed layer 137, as shown in FIG. 15 in accordance with some embodiments. The patterned photoresist layer 138 includes a plurality of through holes 138a, which are filled to form the upper conductive pillars 136 described above in FIG. 6. The processes involved include photolithography and resist development. Then, a conductive layer is plated over the seed layer 137 to fill the through holes 138a, in accordance with some embodiments. Then, the patterned photoresist layer 138 and the seed layer 137 may be removed by an etching process, which may be a dry or a wet process. With such disposition, the alignment mark portion 123b is protected by the third dielectric layer 124 and/or the second dielectric layer 128, so as to prevent the alignment mark portion 123b, and even the seal ring 123c, from being damaged by such etching process.

Then, an upper semiconductor device 132 are disposed on the lower redistribution structure 120, and the alignment mark portion 123b may be adopted to perform the alignment of the upper semiconductor device 132. In some embodiments, the upper semiconductor device 132 may be attached to the lower redistribution structure 120 by an adhesive layer, such as a DAF.

Referring to FIG. 7, an upper encapsulating material 134 is formed on the lower redistribution structure 120 to encapsulate the upper semiconductor device 132 and the upper conductive pillars 136. In the present embodiment, the upper encapsulating material 134 fills the concave portion 128a of the second dielectric layer 128. A planarization process may be optionally applied to remove the excess upper encapsulating material to reveal top surfaces of the upper conductive pillars 136 and the connectors of the upper semiconductor devices 132. Accordingly, the upper encapsulated semiconductor device 130 shown in FIG. 130 is formed, and the upper encapsulated semiconductor device 130 includes the upper semiconductor device 132 encapsulated by the upper encapsulating material 134 and the upper conductive pillars 136 extended through the upper encapsulating material 134. The upper encapsulated semiconductor device 130 and the lower encapsulated semiconductor device 110 are disposed on two opposite sides of the lower redistribution structure 120 respectively.

Figure 8:
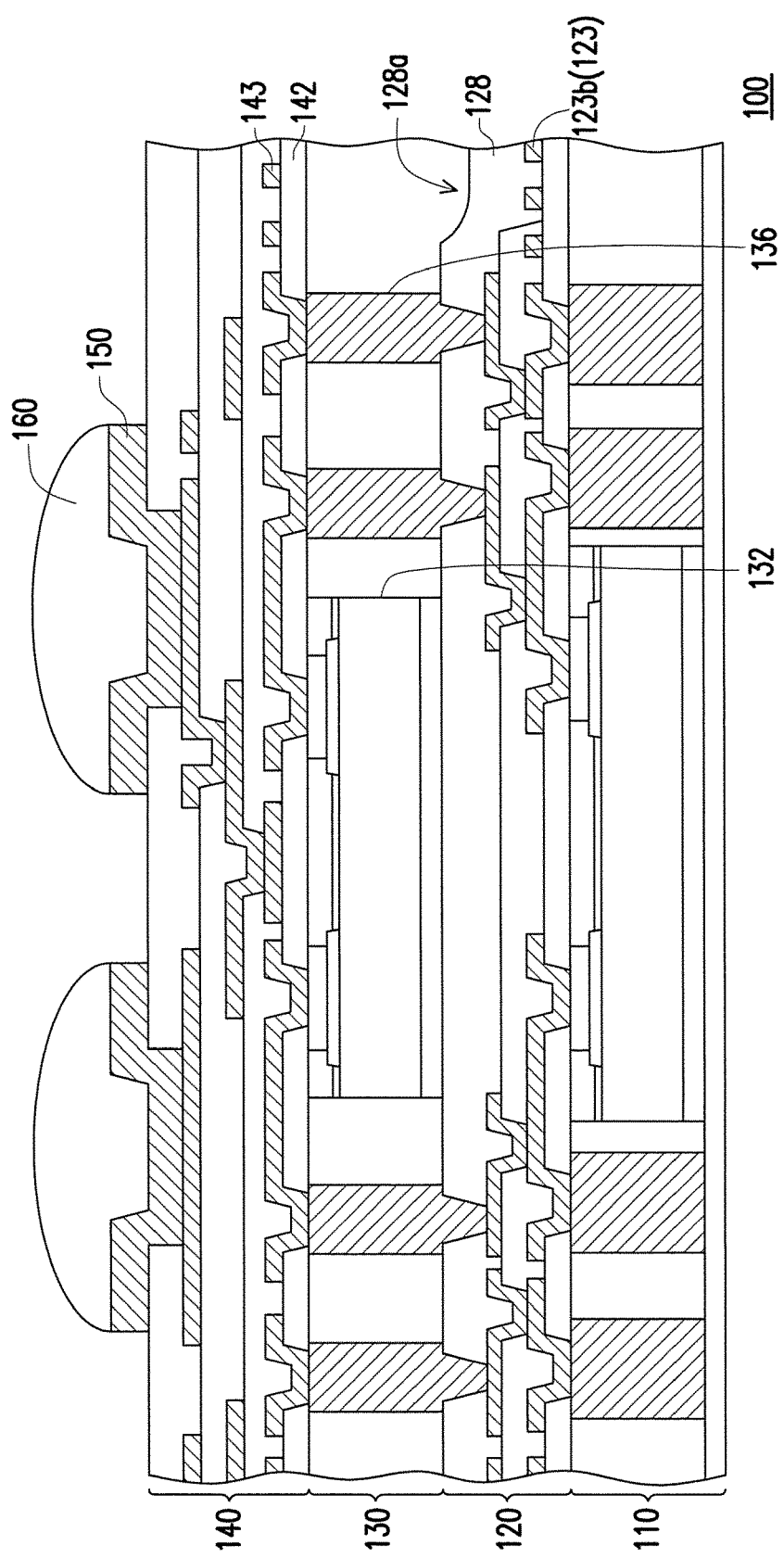

Referring to FIG. 8, then, an upper redistribution structure 140 is formed on the upper encapsulated semiconductor device 130. The upper redistribution structure 140 is electrically connected to the upper semiconductor device 132, and the upper conductive pillars 136 electrically connect the upper redistribution structure 140 and the lower redistribution structure 120. In some embodiments, a under bump metallurgy (UBM) layer 150 may be formed over the upper redistribution structure 140. The UBM layer 150 may also fill the via openings of the topmost dielectric layer of the upper redistribution structure 140. Then, a plurality of electrical terminals 160, such as solder balls, as input/output (I/O) pads mounted on the upper redistribution structure 140 through the UBM layer 150. Accordingly, the semiconductor device package 100 shown in FIG. 8 is formed. It is noted that the arrangement of the dielectric layer of the lower redistribution structure covering the alignment mark portion 123b is applied to a package-on-package (PoP). However, in other embodiments, such arrangement may also be applied to other suitable semiconductor packages such as an encapsulated semiconductor device package with a back-side RDL.

Figure 13:
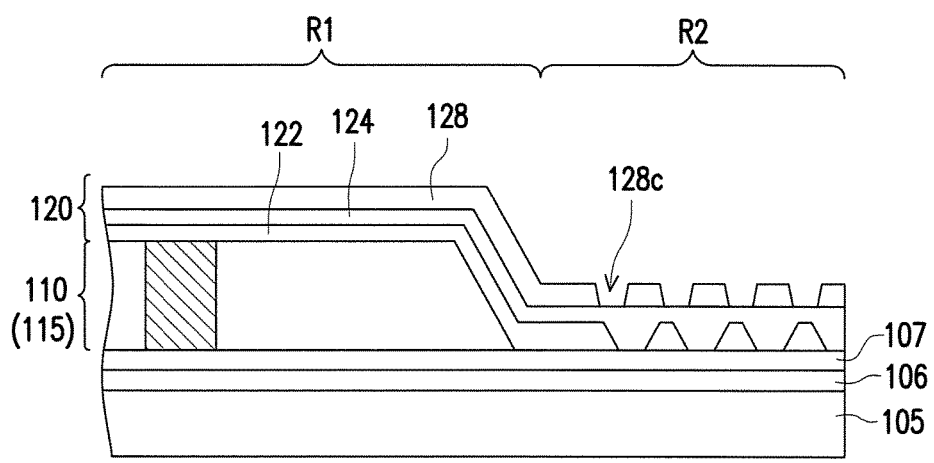
FIG. 13 to FIG. 15 illustrate cross sectional views of intermediate stages in the manufacturing of a semiconductor device package according to some exemplary embodiments of the present disclosure.
Figure 14:
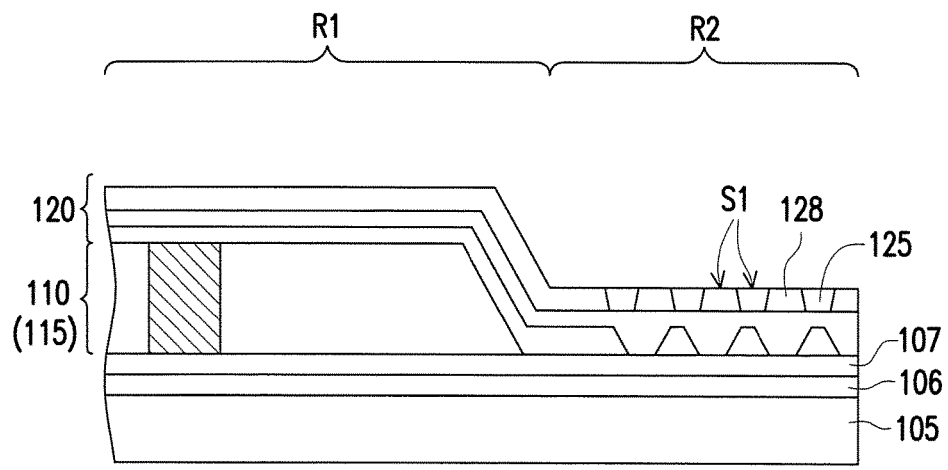

FIG. 13 to FIG. 15 illustrate cross sectional views of intermediate stages in the manufacturing of a semiconductor device package according to some exemplary embodiments of the present disclosure. The manufacturing process of the semiconductor device package 100 shown in FIG. 1 to FIG. 8 is a multi-chip wafer-level semiconductor packaging process, and FIG. 13 to FIG. 15 shows some intermediate stages in the manufacturing of such wafer-level semiconductor device package at a wafer edge portion thereof.

Referring to FIG. 13, after the lower reconstructed wafer 115 including multiple lower encapsulated semiconductor devices 110 are formed, the lower redistribution structure 120 is then formed on the lower reconstructed wafer 115. The lower redistribution structure 120 includes a plurality of dielectric layers 122, 124, 128 and a plurality of RDLs stacked alternately to one another. In some embodiments, a dielectric layer 128 (e.g. the topmost dielectric layer 128) of the lower redistribution structure 120 is formed over the lower reconstructed wafer 115. The dielectric layer 128 includes a wafer portion R1 located on the lower reconstructed wafer 115 and an edge portion R2 extended to a peripheral region of the carrier 105 as shown in FIG. 13. Namely, the carrier 105 may include a packaging region where the lower reconstructed wafer 115 is disposed and a peripheral region R2 surrounding the packaging region, and the dielectric layer 128 is formed over the lower reconstructed wafer 115 and extended to peripheral region R2 of the carrier 105.

Referring to FIG. 5 and FIG. 13, in order to form the conductive via 129 as shown in FIG. 5, a plurality of via openings 128b as shown in FIG. 5 are formed on the wafer portion R1 of the dielectric layer 128. Then, a RDL is formed on the wafer portion R1, and the RDL fills the via openings 128b to form the conductive vias 129. In some embodiments, the via openings 128b may be formed by photolithography process, which utilizes a photomask with via opening patterns. In some embodiments, the photomask is provided with multiple sets of via opening patterns arranged in an array manner corresponding to the arrangement of the lower encapsulated semiconductor devices 110. The photomask may be disposed over the entire carrier 105. Accordingly, when the via openings 128b are formed on the wafer portion R1 of the dielectric layer 128 by utilizing such photomask, a plurality of edge openings 128c are also formed on the edge portion R2 of the dielectric layer 128 shown in FIG. 13. Under such circumstances, during the subsequent process of forming the upper conductive pillars 136 on the lower redistribution structure 120 as shown in FIG. 15, the seed layer 137 would be formed on an uneven surface of the dielectric layer 128 with the edge openings 128c, which may result in peeling of the seed layer 137 due to poor coverage and bonding strength.

Accordingly, referring to FIG. 14 and FIG. 15, a rectifying dielectric layer 125 is formed on the edge portion R2 to fill the edge openings 128c, so a top surface of the rectifying dielectric layer 125 and a top surface of the edge portion R2 jointly form a planar top surface S1. Thereby, the seed layer 137 can cover the planar top surface S1 with great coverage and strong bonding strength, so as to reduce the risk of peeling. In some embodiments, the seed layer 137 may further be extended to a side surface of the edge portion R2 to further enhance the bonding strength between the seed layer 137 and the dielectric layer 128. In some embodiments, a material of the rectifying dielectric layer 128 is the same as a material of the dielectric layer 128, which may include polymers, such as polyimide, polybenzoxazole (PBO), benzocyclobutene (BCB), or any combination thereof.

Then, an upper reconstructed wafer including a plurality of the upper encapsulated semiconductor device 130 shown in FIG. 7 is formed on the wafer portion R1, and the upper redistribution structure 140 shown in FIG. 8 may be formed on the upper reconstructed wafer to form a plurality of semiconductor device packages in a wafer form. Then, a scribing process may be performed along the scribe line SL to form a plurality of independent semiconductor device packages.

In accordance with some embodiments of the disclosure, a semiconductor device package comprises a lower redistribution structure, an upper encapsulated semiconductor device and an upper redistribution structure. The lower redistribution structure comprises a first dielectric layer, a first redistribution line (RDL) disposed on the first dielectric layer and comprising a circuit portion and an alignment mark portion insulated from the circuit portion, a second dielectric layer disposed on the first RDL, wherein the second dielectric layer covers the alignment mark portion, and a second RDL disposed on the second dielectric layer and electrically connected to the first RDL. The upper encapsulated semiconductor device is disposed on the lower redistribution structure and comprises an upper semiconductor device encapsulated by an upper encapsulating material and a plurality of upper conductive pillars extended through the upper encapsulating material. The upper redistribution structure is disposed on the upper encapsulated semiconductor device and electrically connected to the upper semiconductor device, wherein the upper conductive pillars electrically connect the upper redistribution structure and the lower redistribution structure.

In accordance with some embodiments of the disclosure, a method of forming a semiconductor device package comprises: forming a lower encapsulated semiconductor device on a carrier; forming a lower redistribution structure; forming an upper encapsulated semiconductor device on the lower redistribution structure; and forming an upper redistribution structure on the upper encapsulated semiconductor device and electrically connected to the upper semiconductor device. Forming the lower redistribution structure comprises: forming a first dielectric layer on the lower encapsulated semiconductor device; forming a first redistribution line (RDL) on the first dielectric layer, wherein the first RDL comprises a circuit portion electrically connected to the lower encapsulated semiconductor device and an alignment mark portion insulated from the circuit portion; forming a second dielectric layer on the first RDL, wherein the second dielectric layer covers the alignment mark portion; and forming a second RDL on the second dielectric layer, wherein the second RDL is electrically connected to the first RDL. The upper encapsulated semiconductor device comprises an upper semiconductor device encapsulated by an upper encapsulating material and a plurality of upper conductive pillars extended through the upper encapsulating material. The upper conductive pillars electrically connect the upper redistribution structure and the lower redistribution structure.

In accordance with some embodiments of the disclosure, a method of forming a semiconductor device package comprising: forming a lower reconstructed wafer on a carrier, wherein the lower reconstructed wafer comprises a plurality of lower encapsulated semiconductor devices; forming a lower redistribution structure, comprising: forming a dielectric layer over the lower reconstructed wafer, wherein the dielectric layer comprises a wafer portion located on the lower reconstructed wafer and an edge portion extended to a peripheral region of the carrier; forming a plurality of via openings and a plurality of edge openings on the dielectric layer, wherein the via openings are located on the wafer portion and the edge openings located on the edge portion; and forming a redistribution line (RDL) on the wafer portion, wherein the RDL filling the via openings to form a plurality of conductive vias; and forming a rectifying dielectric layer on the edge portion, wherein the rectifying dielectric layer fills the edge openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package comprising:
a lower redistribution structure comprising:
   a first dielectric layer;
   a first redistribution line (RDL) disposed on the first dielectric layer and comprising a circuit portion and an alignment mark portion insulated from the circuit portion;
   a second dielectric layer disposed on the first RDL, wherein the second dielectric layer covers the alignment mark portion; and
   a second RDL disposed on the second dielectric layer and electrically connected to the first RDL;
an upper encapsulated semiconductor device disposed on the lower redistribution structure and comprising an upper semiconductor device encapsulated by an upper encapsulating material and a plurality of upper conductive pillars extended through the upper encapsulating material; and
an upper redistribution structure disposed on the upper encapsulated semiconductor device and electrically connected to the upper semiconductor device, wherein the upper conductive pillars electrically connect the upper redistribution structure and the lower redistribution structure.

2. The semiconductor device package as claimed in claim 1, further comprising:
a lower encapsulated semiconductor device comprising a lower semiconductor device encapsulated by a lower encapsulating material and a plurality of lower conductive pillars extended through the lower encapsulating material, wherein the upper encapsulated semiconductor device and the lower encapsulated semiconductor device are disposed on two opposite sides of the lower redistribution structure respectively.

3. The semiconductor device package as claimed in claim 1, wherein the alignment mark portion is extended to a boundary of the first dielectric layer.

4. The semiconductor device package as claimed in claim 1, wherein the first RDL further comprises a seal ring surrounding the circuit portion and located between the circuit portion and the alignment mark portion.

5. The semiconductor device package as claimed in claim 1, wherein the second dielectric layer covering the alignment mark portion is transparent.

6. The semiconductor device package as claimed in claim 1, further comprising:
a third dielectric layer disposed between the first dielectric layer and the second dielectric layer, wherein the third dielectric layer comprises an opening revealing the alignment mark portion, and the second dielectric layer fills the opening and covers the alignment mark portion; and
a third RDL disposed on the third dielectric layer and electrically connecting the first RDL and the second RDL.

7. The semiconductor device package as claimed in claim 6, wherein the second dielectric layer comprises a concave portion located on a top surface of the second dielectric layer and concave toward the alignment mark portion.

8. The semiconductor device package as claimed in claim 7, wherein a maximum depth of the concave portion is substantially equal to or less than 2 μm.

9. A method of forming a semiconductor device package comprising:
forming a lower encapsulated semiconductor device on a carrier;
forming a lower redistribution structure, comprising:
forming a first dielectric layer on the lower encapsulated semiconductor device;
forming a first redistribution line (RDL) on the first dielectric layer, wherein the first RDL comprises a circuit portion electrically connected to the lower encapsulated semiconductor device and an alignment mark portion insulated from the circuit portion;
forming a second dielectric layer on the first RDL, wherein the second dielectric layer covers the alignment mark portion; and
forming a second RDL on the second dielectric layer, wherein the second RDL is electrically connected to the first RDL;
forming an upper encapsulated semiconductor device on the lower redistribution structure, wherein the upper encapsulated semiconductor device comprises an upper semiconductor device encapsulated by an upper encapsulating material and a plurality of upper conductive pillars extended through the upper encapsulating material; and
forming an upper redistribution structure on the upper encapsulated semiconductor device and electrically connected to the upper semiconductor device, wherein the upper conductive pillars electrically connect the upper redistribution structure and the lower redistribution structure.

10. The method as claimed in claim 9, wherein forming the lower encapsulated semiconductor device on the carrier comprises:
forming a plurality of lower conductive pillars on the carrier;
disposing a lower semiconductor device on the carrier; and
forming a lower encapsulating material encapsulating the lower semiconductor device and the lower conductive pillars.

11. The method as claimed in claim 10, wherein the circuit portion is electrically connected to the lower semiconductor device and the alignment mark portion is insulated from the lower semiconductor device.

12. The method as claimed in claim 9, wherein the first RDL further comprises a seal ring surrounding the circuit portion and located between the circuit portion and the alignment mark portion.

13. The method as claimed in claim 9, wherein forming the lower redistribution structure further comprises:
forming a third dielectric layer on the first dielectric layer before the second dielectric layer is formed on the first RDL;
forming an opening on the third dielectric layer, wherein the opening reveals the alignment mark portion, and the second dielectric layer fills the opening and covers the alignment mark portion; and
forming a third RDL on the third dielectric layer, wherein the third RDL electrically connects the first RDL and the second RDL.

14. The method as claimed in claim 13, wherein the second dielectric layer comprises a concave portion located on a top surface of the second dielectric layer and concave toward the alignment mark portion.

15. The method as claimed in claim 9, wherein the second dielectric layer covering the alignment mark portion is transparent.

16. A method of forming a semiconductor device package comprising:
providing a lower reconstructed wafer on a carrier, wherein the lower reconstructed wafer comprises a plurality of lower encapsulated semiconductor devices;
forming a lower redistribution structure, comprising:
forming a dielectric layer over the lower reconstructed wafer, wherein the dielectric layer comprises a wafer portion located on the lower reconstructed wafer and an edge portion extended to a peripheral region of the carrier;
forming a plurality of via openings and a plurality of edge openings on the dielectric layer, wherein the via openings are located on the wafer portion and the edge openings located on the edge portion; and
forming a redistribution line (RDL) on the wafer portion, wherein the RDL filling the via openings to form a plurality of conductive vias; and
forming a rectifying dielectric layer on the edge portion, wherein the rectifying dielectric layer fills the edge openings.

17. The method as claimed in claim 16, further comprising:
forming a plurality of upper conductive pillars on the lower redistribution structure, comprising:
forming a seed layer on the dielectric layer, wherein a top surface of the rectifying dielectric layer and a top surface of the edge portion jointly form a planar top surface, and the seed layer covers the planar top surface.

18. The method as claimed in claim 17, wherein the seed layer is extended to a side surface of the edge portion.

19. The method as claimed in claim 16, further comprising:
forming an upper reconstructed wafer on the wafer portion, wherein the upper reconstructed wafer comprises a plurality of upper encapsulated semiconductor devices; and
forming an upper redistribution structure on the upper reconstructed wafer.

20. The method as claimed in claim 16, wherein a material of the rectifying dielectric layer is the same as a material of the dielectric layer.

* * * * *